US011185918B2

(12) United States Patent
Zhang et al.

(10) Patent No.: US 11,185,918 B2
(45) Date of Patent: Nov. 30, 2021

(54) SELF-ALIGNING METAL PATTERNING BASED ON PHOTONIC SINTERING OF METAL NANOPARTICLES

(71) Applicant: National Research Council of Canada, Ottawa (CA)

(72) Inventors: Zhiyi Zhang, Ottawa (CA); Ye Tao, Ottawa (CA); Ta-Ya Chu, Ottawa (CA); Gaozhi Xiao, Ottawa (CA)

(73) Assignee: NATIONAL RESEARCH COUNCIL OF CANADA, Ontario (CA)

( * ) Notice: Subject to any disclaimer, the term of this patent is extended or adjusted under 35 U.S.C. 154(b) by 390 days.

(21) Appl. No.: 15/740,589

(22) PCT Filed: Jun. 30, 2016

(86) PCT No.: PCT/CA2016/050769
§ 371 (c)(1),
(2) Date: Dec. 28, 2017

(87) PCT Pub. No.: WO2017/004704
PCT Pub. Date: Jan. 12, 2017

(65) Prior Publication Data
US 2018/0185922 A1 Jul. 5, 2018

Related U.S. Application Data

(60) Provisional application No. 62/188,553, filed on Jul. 3, 2015.

(51) Int. Cl.
*B22F 3/105* (2006.01)
*B22F 3/24* (2006.01)
(Continued)

(52) U.S. Cl.
CPC .............. *B22F 7/04* (2013.01); *B22F 3/105* (2013.01); *B22F 3/24* (2013.01); *B22F 5/00* (2013.01);
(Continued)

(58) Field of Classification Search
CPC .......... B22F 7/04; B22F 3/105; G03F 7/0043; G03F 7/2014; G03F 7/40; H01L 51/0541; H01L 51/0023; H05K 1/097
See application file for complete search history.

(56) References Cited

U.S. PATENT DOCUMENTS 5,602,047 A    2/1997   Tsai
5,705,826 A * 1/1998   Aratani ............... H01L 51/0035
                                                                   257/40
(Continued)

FOREIGN PATENT DOCUMENTS

CA     2 593 884 A1    1/2008
EP        0402942      12/1990
(Continued)

OTHER PUBLICATIONS

Takenobu et al., "High-performance transparent flexible transistors using carbon nanotube films", Appl. Phys. Lett. 88, 033511; https://doi.org/10.1063/1.2166693 (Year: 2006).*
(Continued)

*Primary Examiner* — Patricia L. Hailey
*Assistant Examiner* — Christopher D. Moody
(74) *Attorney, Agent, or Firm* — Wegman Hessler

(57) ABSTRACT

A method is disclosed for aligning layers in fabricating a multilayer printable electronic device. The method entails providing a transparent substrate upon which a first metal layer is deposited, providing a transparent functional layer over the first metal layer, depositing metal nano particles over the functional layer to form a second metal layer,
(Continued)

exposing the metal nano particles to intense pulsed light via an underside of the substrate to partially sinter exposed particles to the functional layer whereby the first metal layer acts as a photo mask, and washing away unexposed particles using a solvent to leave partially sintered metal nano particles on the substrate.

21 Claims, 5 Drawing Sheets

(51) Int. Cl.
| | |
|---|---|
| B22F 5/00 | (2006.01) |
| B22F 7/04 | (2006.01) |
| G03F 7/004 | (2006.01) |
| G03F 7/20 | (2006.01) |
| G03F 7/40 | (2006.01) |
| H01L 51/00 | (2006.01) |
| H01L 51/05 | (2006.01) |
| H05K 1/09 | (2006.01) |
| H05K 3/06 | (2006.01) |
| H05K 3/46 | (2006.01) |
| B82Y 20/00 | (2011.01) |

(52) U.S. Cl.
CPC .......... *G03F 7/0043* (2013.01); *G03F 7/2014* (2013.01); *G03F 7/2022* (2013.01); *G03F 7/40* (2013.01); *B22F 2003/247* (2013.01); *B22F 2003/248* (2013.01); *B22F 2301/052* (2013.01); *B22F 2301/10* (2013.01); *B22F 2301/255* (2013.01); *B82Y 20/00* (2013.01); *H01L 51/0022* (2013.01); *H01L 51/0023* (2013.01); *H01L 51/0096* (2013.01); *H01L 51/0541* (2013.01); *H01L 51/0545* (2013.01); *H01L 2251/301* (2013.01); *H05K 1/097* (2013.01); *H05K 3/06* (2013.01); *H05K 3/064* (2013.01); *H05K 3/4644* (2013.01); *H05K 2201/0145* (2013.01); *H05K 2203/013* (2013.01); *H05K 2203/0548* (2013.01); *H05K 2203/0766* (2013.01); *H05K 2203/107* (2013.01); *H05K 2203/1131* (2013.01)

(56) References Cited

U.S. PATENT DOCUMENTS

| | | | |
|---|---|---|---|
| 5,989,944 | A | 11/1999 | Yoon |
| 7,223,700 | B2 | 5/2007 | Wong |
| 7,615,483 | B2 | 11/2009 | Daniel et al. |
| 7,745,101 | B2 | 6/2010 | Tutt et al. |
| 7,745,202 | B2 | 6/2010 | Higa |
| 7,749,396 | B2 | 7/2010 | Chow |
| 8,278,138 | B2 | 10/2012 | Yang |
| 8,465,905 | B2 | 6/2013 | Schuster |
| 2006/0032437 | A1 | 2/2006 | McMacklin et al. |
| 2006/0108579 | A1* | 5/2006 | Kim ............... H01L 51/0525 257/40 |
| 2007/0178616 | A1 | 8/2007 | Arai et al. |
| 2007/0190673 | A1 | 8/2007 | Ko |
| 2007/0259478 | A1* | 11/2007 | Arai ............... H01L 51/102 438/99 |
| 2008/0099843 | A1* | 5/2008 | Wang ............... H01L 51/102 257/347 |
| 2008/0102567 | A1* | 5/2008 | Wang ............... H01L 51/102 438/155 |
| 2008/0278068 | A1* | 11/2008 | Huang ............... G03F 7/0007 313/504 |
| 2008/0290787 | A1* | 11/2008 | Cok ............... H01L 51/5203 313/503 |
| 2009/0145640 | A1 | 6/2009 | Toyoda |
| 2009/0181172 | A1 | 7/2009 | Parpia et al. |
| 2009/0274833 | A1 | 11/2009 | Li et al. |
| 2013/0165549 | A1 | 6/2013 | Wagman et al. |
| 2013/0213817 | A1 | 8/2013 | Lo |
| 2014/0333916 | A1 | 11/2014 | Bessonov |
| 2019/0198786 | A1* | 6/2019 | Shimizu ............... H01L 51/0003 |

FOREIGN PATENT DOCUMENTS

| | | |
|---|---|---|
| EP | 1933393 | 6/2008 |
| EP | 2 257 969 A2 | 2/2009 |
| GN | 104750311 A | 7/2015 |
| JP | H07273009 | 10/1995 |
| JP | 2007-129007 A | 5/2007 |
| JP | 2008294391 | 12/2008 |
| JP | 2012-522114 T | 9/2012 |
| JP | 2013065633 | 4/2013 |
| JP | 2015-111563 A | 6/2015 |
| WO | 2006113400 | 10/2006 |
| WO | 2009108771 | 9/2009 |
| WO | 2010034815 A1 | 4/2010 |
| WO | 2011021763 | 2/2011 |
| WO | 2014072016 | 5/2014 |

OTHER PUBLICATIONS

Bakhishev et al., "Investigation of Gold Nanoparticle Inks for Low-Temperature Lead-Free Packaging Technology", Journal of Electronic Materials, vol. 38, No. 12, 2009, p. 2720-2725, DOI: 10.1007/s11664-009-0918-9 (Year: 2009).*
Wünscher et al., "Electronic Supplementary Information: Progress of alternative sintering approaches of inkjet-printed metal inks and their application for manufacturing of flexible electronics", Journal of Materials Chemistry C, p. 1-12, 2014 (Year: 2014).*
International Search Report and Written Opinion dated Jan. 12, 2017 for PCT/CA2016/050767 filed Jun. 30, 2016.
International Search Report and Written Opinion dated Jan. 12, 2017 for PCT/CA2016/050768 filed Jun. 30, 2016.
International Search Report and Written Opinion dated Jan. 12, 2017 for PCT/CA2016/050769 filed Jun. 30, 2016.
International Preliminary Report on Patentability for International Patent Application No. PCT/CA2016/050767 dated Jan. 9, 2018.
International Search Report and Written Opinion dated Sep. 12, 2016 for PCT/CA2016/050767 filed Jun. 30, 2016.
Abbel, et al., "Narrow Conductive Structures with High Aspect Ratios Through Single-Pass Inkjet Printing and Evaporation-Induced Dewetting", Advanced Engineering Materials, DOI: 10.1002/adam.201400339, pp. 1-5, 2014.
Dockendorf, et al., "Size reduction of nanoparticle ink patterns by fluid-assisted dewetting", Applied Physics Letters 88, 2006.
L. Jacot-Descombes, et al., "Fabrication of epoxy spherical microstructures by controlled drop-on-demand inkjet printing", Journal of Micromechanics and Microengineering, pp. 1-9, 2012.
Nguyen, et al., "An approach for controlling printed line-width in high resolution roll-to-roll gravure printing", Journal of Micromechanics and Microengineering, pp. 1-11, 2013.
Soltman, et al., "Inkjet-Printed Line Morphologies and Temperature Control of the Coffee Ring Effect", Langmuir 2008, 24, pp. 2224-2231.
Soltman, et al., "Methodology for Inkjet Printing of Partially Wetting Films", Langmuir Article, 2010, pp. 15686-15693.
Van Osch, et al., "Inkjet Printing of Narrow Conductive Tracks on Untreated Polymeric Substrates", Advanced Materials, 2008, pp. 343-345.
International Search Report and Written Opinion dated Sep. 14, 2016 for PCT/CA2016/050768 filed Jun. 30, 2016.
Yokota et al., "Low-voltage organic transistor with subfemtoliter inkjet source-drain contacts", MRS Communications (2011), pp. 3-6.
Yin et al., "Inkjet printing for flexible electronics: Materials, processes and equipments", Chinese Science Bulletin, Oct. 2010, vol. 55, No. 30, pp. 3383-3407.
Tang, et al., "Inkjet Printing Narrow Fine Ag Lines on Surface Modified Polymeric Films", Department of Electronic Engineering, Shanghai Jiao Tong University, China, 2013 IEEE, pp. 1171-1174.

(56) References Cited

OTHER PUBLICATIONS

Suzuki et al., "All-printed Organic TFT Backplanes for Flexible Electronic Paper", International Symposium on Electronic Paper, The Imaging Society of Japan, 2010, pp. 1-6.
Sirringhaus et al., "High-Resolution Inkjet Printing of All-Polymer Transistor Circuits", Science, vol. 290, Dec. 15, 2000, pp. 2123-2126.
Sele, et al., "Lithography-Free, Self-Aligned Inkjet Printing with Sub-Hundred-Nanometer Resolution", Advanced Materials, 2006, 17, No. 8, Apr. 2018, pp. 997-1001.
Rogers, et al., "Printing Process Suitable for Reel-to-Reel Production of High-Performance Organic Transistors and Circuits", Advanced Materials, 1999, 11, No. 9, pp. 741-745.
SIJ Technology Inc. Super fine inkjet printer, https://web.archive.org/web/20141204024608/http://www.sijtechnology.
Park, et al., "High-resolution electrohydrodynamic jet printing", Nature Publishing Group, 2007, pp. 782-789.
Li, "OTFT Integration Strategies," pp. 56-100.
Kang, et al., "Self-aligned flexible all-polymer transistor: Ultraviolet printing", Applied Physics Letters 93, 2008, pp. 1-3.
Jeong et al., "Self-Defined Short Channel Formation With Micromolded Separator and Inkjet-Printed Source/Drain Electrodes in OTFTs", IEEE Electron Device Letters, vol. 32, No. 12, Dec. 2011, pp. 1758-1760.
Cheng, et al., "Effect of PVP-coated silver nanoparticles using laser direct patterning process by photothermal effect", Microelectronic Engineering 88, 2011, pp. 929-934.
Doggart et al., "Facile Inkjet-Printing Self-Aligned Electrodes for Organic Thin-Film Transistor Arrays with Small and Uniform Channel Length", Applied Materials and Interfaces, 2010, pp. 2189-2192.
Frederix et al., "Biosensing Based on Light Absorption of Nanoscaled Gold and Silver Particles", Analytical Chemistry, vol. 75, No. 24, Dec. 15, 2003, pp. 6894-6900.
Kang et al., "Sintering of Inkjet-Printed Silver Nanoparticles at Room Temperature Using Intense Pulsed Light", Journal of Electronic Materials, vol. 40, No. 11, 2011, pp. 2268-2277.
Kumpulainen et al., "Low temperature nanoparticle sinterning with continuous wave and pulse lasers", Optics & Laser Technology, 43, 2011, pp. 570-576.
Lesyuk et al., "Low-energy pulsed laser treatment of silver nanoparticles for interconnects fabrication by ink-jet method", Microelectronic Engineering, 88, 2011, pp. 318-321.
Palfinger et al., "Fabrication of n- and p-Type Organic Thin Film Transistors with Minimized Gate Overlaps by Self-Aligned Nanoimprinting", Advanced Materials, 2010, 22, pp. 5115-5119.
Roy et al., "Self-aligned Inkjet Printing of TFTs/Circuits", IEEE 2012, Microsystems Center, Tyndall National Institute, University College Cork, Lee Maltings, Dyke Parade, Cork, Ireland, pp. 1-4.
Tseng et al., "High-speed organic transistors fabricated using a novel hybrid-printing technique", Organic Electronics 12, 2011, pp. 1120-1125.
Wikipedia—Photonic curing, http://en.wikipedia.org/wiki/Photonic_curing, Oct. 2014, pp. 1-3.
International Preliminary Report on Patentability for International Patent Application No. PCT/CA2016/050769 dated Jan. 9, 2018.
International Search Report and Written Opinion dated Sep. 14, 2016 for PCT/CA2016/050769 filed Jun. 30, 2016.
Extended European Search Report in European Application No. 16820595.3 dated Jan. 24, 2019, pp. 1-7.
Office Action issued in related Chinese Patent Application No. 201680039569.6 dated Aug. 4, 202; 12 pages.
Office Action issued in Japanese Patent Application No. 2017-568351 dated Oct. 26, 2020; 7 pages.

* cited by examiner

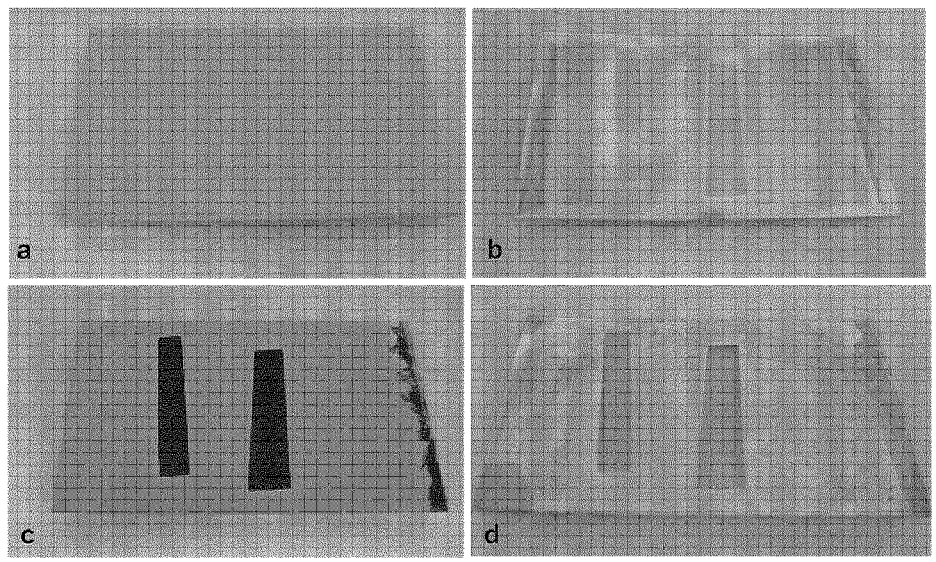
*Figures 3A-3D*
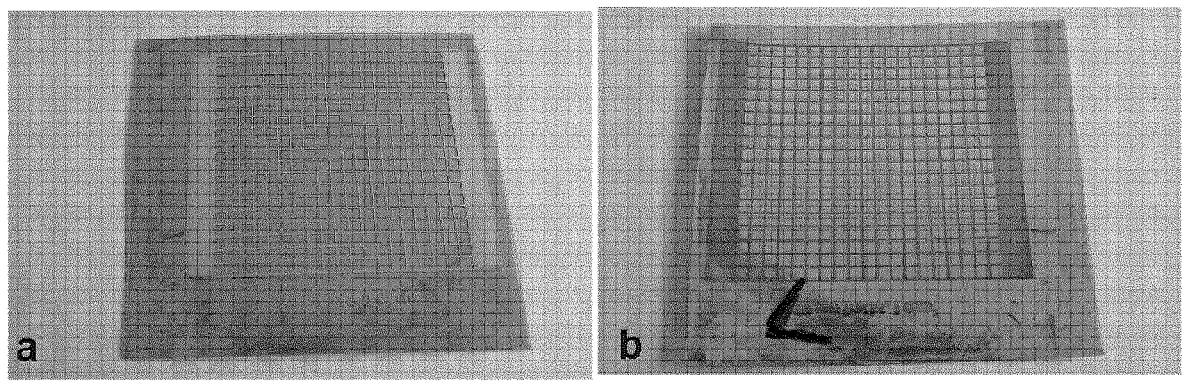
*Figure 4A*          *Figure 4B*

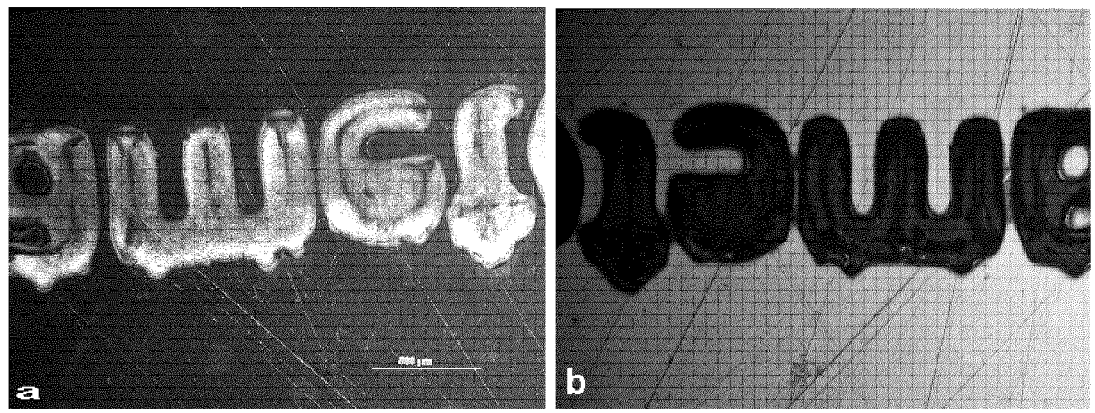
*Figure 5A*  *Figure 5B*
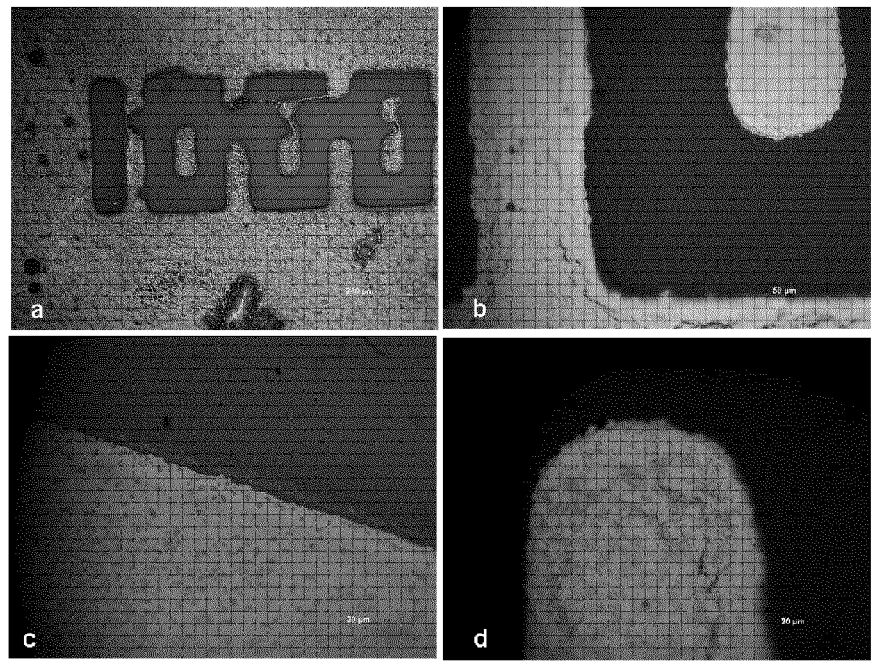
*Figures 6A-6D*

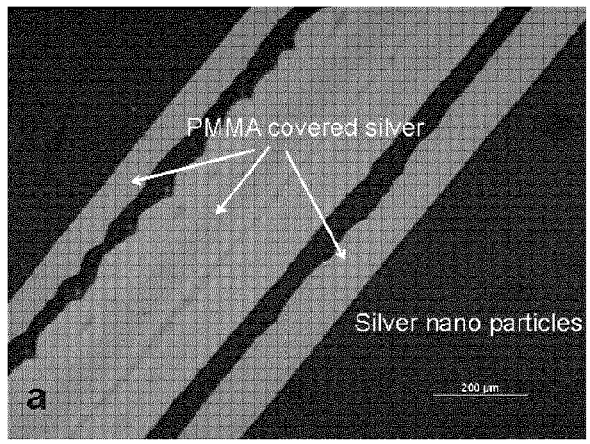 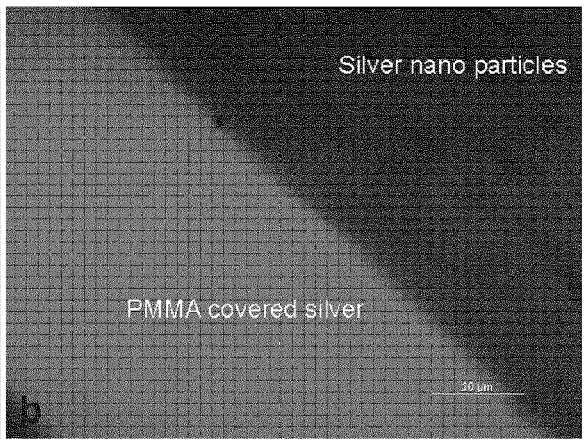
*Figure 9A*  *Figure 9B*
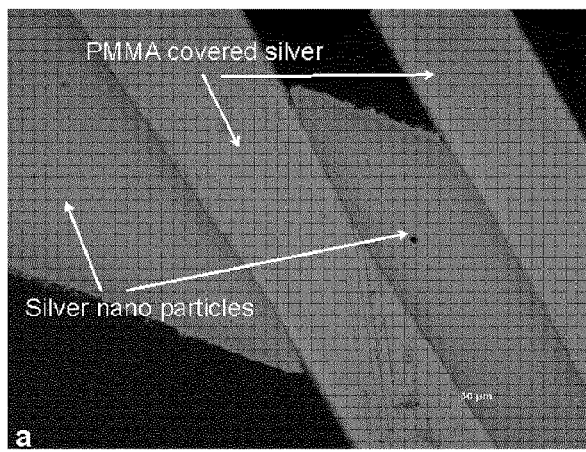 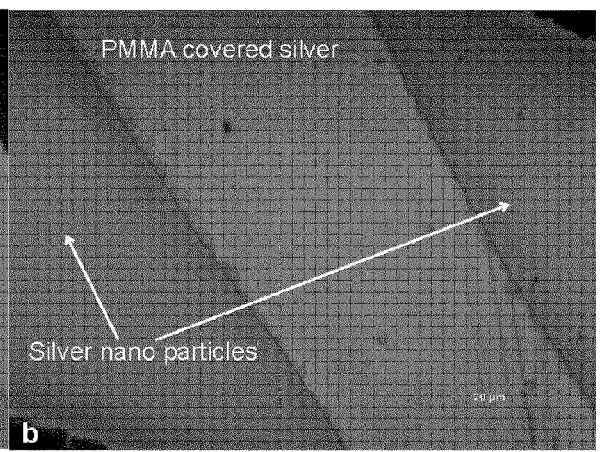
*Figure 10A*  *Figure 10B*

SELF-ALIGNING METAL PATTERNING BASED ON PHOTONIC SINTERING OF METAL NANOPARTICLES

TECHNICAL FIELD

The present disclosure relates generally to fabrication techniques for printable electronic devices and, in particular, to a technique for aligning layers in fabricating a multilayer printable electronic device.

BACKGROUND

Printing functional inks on flexible and low-cost substrates is an increasingly popular method of fabricating electronic devices. A multilayer printing process, which is frequently utilized in fabricating electronic devices, remains challenging because it is difficult to achieve the required alignment or registration precision when an upper layer is printed over an under layer. To address the issues in layer-to-layer alignment accuracy, a self-alignment process was proposed (Palfinger et al., Adv. Mater. 2010, 22, 5115-5119) for printing organic transistors. In this method, the first metal layer is patterned by nano-imprint lithography or a micro-contact printing process followed by a wet etching step. This patterned metal layer later acts as a mask to pattern the next metal layer via a traditional or a roll-to-roll (R2R) photo-lithography process and a lift-off step. However, in this proposed self-alignment process, metal layers are vacuum evaporated, and several photo-lithography, wet-etching, and lift-off steps are required. To make the self-alignment process truly compatible with R2R printing process, it is desirable to have metal layers, which are printable and patternable using minimum wet steps.

UV-curable metal inks, which are UV-curable resins filled with metal particles, are potential candidates for use in a self-alignment process to replace the vacuum deposited metal layers. However, there are serious drawbacks in using UV-curable metal inks in the self-alignment process. Firstly, UV-curable metal inks contain photo initiators and cross-linkers, which remain in the film and reduce the conductivity of the resulting metal film. Secondly, printed metal films are opaque, the UV penetration depth is very limited in this kind of film, and the thickness that can be cross-linked is also very limited. Thirdly, the achievable patterning resolution of the inks is fundamentally limited to the size of its metal particles.

Accordingly, a new or improved self-aligning technique would be highly desirable in order to facilitate fabrication of multilayer printable electronic devices.

SUMMARY

The present disclosure provides a new self-aligning technique for fabricating multi-layer printable electronic devices. This method enables high-precision alignment of the metal pattern printed on the upper layer with the ink pattern on the lower or under layer. A metal nano particle ink or any other equivalent ink acts as a negative photoresist so that the first metal layer printed or deposited on a transparent substrate can act as a mask. Intense light pulses are then applied from the backside of the substrate to partially sinter the metal nano particles that are exposed. The metal nano-particles in the shaded area are not sintered and thus can be washed away. Partially sintered particles are then fully sintered in a post sintering step. Partially sintering involves exposing the particles to the minimum required optical power with the shortest pulses to minimally sinter the exposed particles so they are just barely connected to the functional layer to resist washing off the functional layer during subsequent washing.

Accordingly, one inventive aspect of the present disclosure is a method for aligning metal layers in fabricating a multilayer printable electronic device. The method entails providing a transparent substrate upon which a first metal layer is deposited, providing a transparent functional layer over the first metal layer, depositing metal nano particles over the functional layer to form a second metal layer, exposing the metal nano particles to intense pulsed light via an underside of the substrate to partially sinter exposed particles to the functional layer whereby the first metal layer acts as a photo mask, and washing away unexposed particles using a solvent to leave partially sintered metal nano particles on the substrate. The functional material may be a conductor, semiconductor, dielectric, electroluminescent, photovoltaic, or any other electronic function.

This summary is provided to highlight certain significant inventive aspects but is not intended to be an exhaustive or limiting definition of all inventive aspects of the disclosure. Other inventive aspects may be disclosed in the detailed description and drawings.

BRIEF DESCRIPTION OF THE DRAWINGS

Further features and advantages of the present technology will become apparent from the following detailed description, taken in combination with the appended drawings, in which:

FIG. 3A illustrates a dried coating of silver nano particle ink produced on PET film;

FIG. 3B illustrates the coating of silver nano particles on PET after the sample was exposed to intense pulsed light under another PET film bonded with dark tape strips on its upper surface;

FIG. 3C illustrates the coating of silver nano particles on PET when the exposed sample is immersed into dehydronapthalene for development;

FIG. 3D illustrates the coating that remains after the unexposed sample was washed with dehydronapthalene;

FIG. 4A illustrates the pre-existing silver pattern of silver nano particles coating on PET;

FIG. 4B illustrates the coating formed of silver nano particles on the opposite side of the above PET after the sample was exposed to light from the side with the pre-existing silver pattern and washed with a solvent;

FIG. 5A illustrates a pre-existing silver pattern formed of silver nano particles on one side of PET;

FIG. 5B illustrates the pattern of silver nano particles on the opposite side after the sample was exposed to light from the patterned side and washed with a solvent;

FIGS. 6A-6D depict the processed coating of silver nano particle ink on PET film wherein the coating, before being developed in water, was exposed to intense pulsed light from the back side of the PET which was previously printed with a silver pattern;

FIGS. 9A and 9B depict a coating of silver nano particle ink on PMMA-covered PET film wherein 300 nm PMMA was coated on a PET surface with the printed silver pattern and the sample was exposed to intense pulsed light from the back side of the PET and the subsequent development was carried out in ethanol; and FIGS. 10A and 10B depict a line of silver nano particle ink on a PMMA-covered PET film wherein the line of ink was printed on 300 nm-PMMA on PET film using an inkjet printer and the light exposure was from the back side of the PET film and the development was carried out in water.

It will be noted that throughout the appended drawings, like features are identified by like reference numerals.

DETAILED DESCRIPTION

Figure 1:
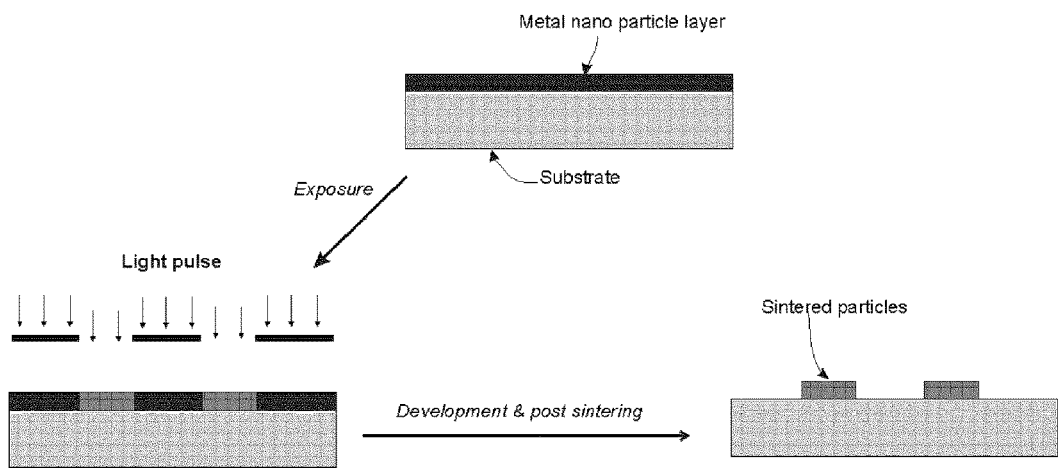
FIG. 1 illustrates an example of how metal nano particles are used as a negative photoresist.

Disclosed herein is a method (or process) of using a photonic sintering process and metal nano particle inks for self-alignment metal patterning. This method obviates the need for multiple photolithography steps or for metal vacuum deposition. High-precision alignment between the metal pattern in the upper layer and the lower and under layer is achieved by using the metal nano particle ink as a negative photoresist. The first metal layer printed on a transparent substrate acts as a mask to block light applied from the back side of the substrate. The intense light pulses applied from the backside of the substrate partially sinter the nano particles that are exposed, i.e. not covered by the mask. The metal nano-particles that are masked are unaffected by the sintering and thus can be washed away.

The method is primarily intended for use in fabricating electronic devices having a multilayer structure by printing or an equivalent low-cost deposition process. Many electronic devices require a multilayer structure, in which the pattern of one of the upper layers has to be precisely aligned with the pattern in the layer underneath in order to function correctly or optimally. For instance, a transistor requires that the metal electrodes in the upper layer be precisely aligned with the ones in the layer underneath. The method disclosed herein uses photonic sintering of metal nano particles to precisely align the metal pattern in the upper layer with the metal pattern in the layer beneath. In other words, this method facilitates fabrication of multilayer printable electronic device which require precise alignment of the upper and lower layers.

Metal nano particles exhibit strong plasmonic absorption in the wavelength range from UV to near IR, and thus can be heated by light. Metal nano particles also have very low melting temperature because of their nano size and thus can be sintered at a very low temperature such as, for example, 120° C. As such, it is possible to use the heat generated by the plasmonic absorption to sinter the particles onto the substrate. Both laser and intense pulsed light may be used to directly irradiate and thus sinter metal nano-particle particles to produce coatings and patterns on the substrate.

The photonic sintering of metal nano particles can cause the individual particles to form a dense metal film. This process is somewhat similar to the UV-caused crosslinking of a polymer, which makes the polymer insoluble. However, there are a few fundamental differences between the two: 1) the UV-crosslinking reaction is directly caused by the photons in the UV light, and therefore the cross-linking depth is limited by the depth of light penetration. In the case of printed metal films, the cross-linking depth is limited to the surface area; while the sintering of the metal nano particles are caused by the local heat generated by the intense, short light pulses. Although the light pulse is also limited in depth of penetration, the heat generated by the light pulses can transfer over a reasonable range (100's nm). This transfer range is sufficiently large to sinter metal films used in typical printable electronics (having a typical thickness of ~100's nm). Moreover, photonic sintering yields very good lateral patterning resolution (100's nm vs 10's μm). Furthermore, the heat transfer range can be controlled by varying the pulse intensity, frequency and duration; 2) the UV-crosslinking process requires photo initiators and cross-linkers, which will remain in the films and affect their properties. In contrast, the sintering of the metal nano particles is basically a particle melting process, such that the resulting films have properties very similar to the bulk material; 3) the UV-crosslinking process uses the inks that are based on the UV curable polymer filled with metal particles, normally several micrometers in diameter or length. The achievable patterning resolution cannot be smaller than the particle size.

FIG. 1 illustrates a method of using metal nano particles to function as a negative photoresist. The metal nano particles are first deposited on the substrate by a suitable deposition method, such as coating or printing, using metal nano particle-suspended liquid, or so-called nano ink. After the particles have dried, the particles are exposed to intense pulsed light, through a photo mask, whose wavelength substantially covers or matches that of the plasmonic absorption of the particles. The exposed particles are partially sintered by the absorbed energy to thereby adhere to the substrate when a solvent is used to wash away the unexposed particles in the development process. Finally, a post sintering process is performed to fully sinter the particles onto the substrate to become a dense metal film with desired performance characteristics.

Figure 2:
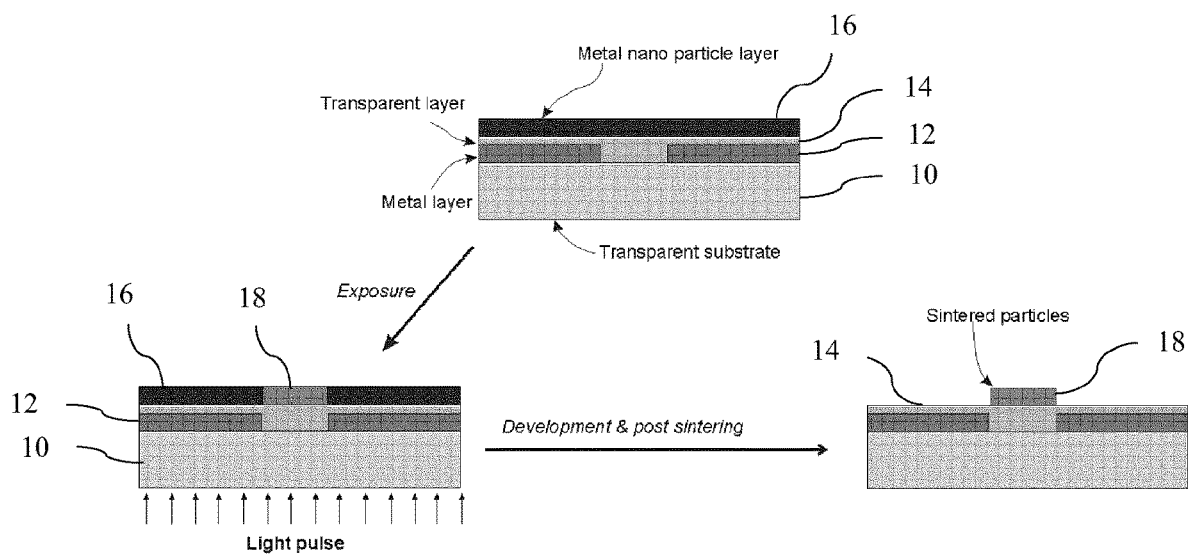
FIG. 2 illustrates, by way of example, a method of self-aligning metal patterning based on the photo sintering of metal nano particles.

FIG. 2 illustrates the self-alignment method for metal patterning. The method employs photonic sintering of metal nano particles. The nano particle ink is deposited on the substrate surface with the first metal pattern underneath, either separated by a transparent layer of material for special functions or by the substrate itself. The light is shined from the back side of the substrate. The metal pattern on the under layer acts as a photo mask. Exposed particles adhere to the substrate due to photonic-induced partial sintering. These partially sintered particles remain on the surface through the development process. After being thermally annealed, the remaining material, which is precisely aligned to the pre-existed metal pattern, is fully sintered in a post sintering process to obtain the desired performance characteristics, such as conductivity. FIG. 2 shows the structure of a stack composed of a transparent substrate 10 upon which a first metal layer 12 is deposited, a transparent functional layer 14 over the first metal layer, and a second metal layer 16 that is formed by depositing metal nano particles on the transparent functional layer 14. The metal nano particles are then partially photonically sintered to leave partially sintered particles 18 that form a pattern or line that remain after the second metal layer is washed with an appropriate solvent. The sintered particles 18 that remain after sintering are aligned with the first metal layer. The functional layer is made of a functional material which may be a conductor, semiconductor, dielectric, electroluminescent, photovoltaic, or any other electronic function.

Photonic sintering of metal nano particles is fundamentally different from the conventional UV-induced photo crosslinking of polymer widely used in photolithography-based fabrication techniques. The conventional UV-induced photo crosslinking process relies on light penetration in the film to be cured. The UV light does not penetrate well in a printed metal film. In the present method, the photonic sintering patterning process is fundamentally still a sintering process, in which particles are fused together at their surfaces through the heat generated by the plasmonic absorption of the metal nano particles. The heat may be quickly transferred from the exposed particles to adjacent unexposed particles, due to the high thermal conductivity of metal, causing sintering in the unexposed area, both in the thickness direction and side direction of the nano particle coating. This effect is critical in sintering particles through the whole coating thickness, but may also cause the sintering in the masked edge area and thus reduce the patterning resolution. In order to minimize this negative effect, the present method employs partial sintering. It uses the minimum required optical power with the shortest pulses to minimally sinter the exposed particles so they are just barely connected or fused to the level that they become resistant to the solvent used to disperse or suspend the nano particles and have a sufficient adhesion on the substrate. With this, the unexposed nano particles can be easily and cleanly washed away with the solvent used to disperse the particles in their original liquid sample or ink, and the exposed ones will stay on the substrate. The desired performance characteristic, such as electrical conductivity, of the obtained film formed by the partially connected nano particles might be poor at this stage, but can be dramatically improved to the application-required level after the particles are fully sintered in a post sintering process.

The method was demonstrated by coating a thin layer of silver nano particles on a piece of DuPont PET film (Melinex ST 505) and exposing the coating to intense pulsed light under another piece of PET film with dark polymer tape strips bonded on its upper surface. In this first example (Example 1) the coating of silver nano particles on PET film was prepared using XF-1 silver nano ink produced by Xerox research center in Canada (XRCC) and the blade coating equipment (509MC) of Erichsen, and dried at room temperature (as shown by FIG. 3A). Another piece of PET film with bonded dark tape strips on its upper surface was used as a photo mask and placed on top of the coated PET film as illustrated by way of example in FIG. 1. After the nano-particle coating was exposed to the programmed intense pulsed light (2.4 kV, double exposure at 200 microseconds for each one, with a plate displacement of 5 mm in each cycle) in the photonic curing R&D system (Sinteron 2000 from Xenon Corporation) through the above mask, the lit part turned a gold color, while the blocked and thus unexposed parts kept their original color (as shown in FIG. 3B). When the sample was immersed into dehydronapthalene, the unexposed parts turned a black color instantly (as shown in FIG. 3C) and gradually diffused into the solvent. The transparent PET was recovered in the unexposed area to show the corresponding patterns of the dark tape strips, after the unexposed silver particles were completely washed away with sharp edges left in the remaining coating (as shown in FIG. 3D). The resistance of the remaining coating (which was 660 nm thick) was measured to be in the range of 30 to 60 k$\Omega$ between two adjacent corners. The resistance value dropped to 0.9 to 1.3$\Omega$ after the sample was thermally annealed at 130° C. for 30 minutes.

To apply the method above in self-aligning silver patterning as illustrated by way of example in FIG. 2, the effect of the substrate should be considered. As light travels through the coating substrate before reaching the nano particle coating, its energy may be partially absorbed by the substrate and converted to heat. This heat can combine with the particle-to-particle transfer discussed earlier and affect the lithographic process. The light exposure at slightly reduced dosage was tested to be effective in substantially avoiding, or at least minimizing, this condition and thus implementing the present method of self-aligned metal deposition. In another example (Example 2), a PET film (e.g. Melinex ST 505 from DuPont) with a stable printed silver pattern on one side was coated with XF-1 silver nano ink produced by the Xerox Research Center in Canada (XRCC) on another side using the blade coating equipment, e.g. the 509MC from Erichsen). The room temperature-dried coating was placed in the photonic curing R&D system (e.g. Sinteron 2000 from Xenon Corporation) with the pre-printed silver facing up and the new coating facing down for light exposure (which was carried out, for example, at 2.4 kV, with double exposure at 180 microseconds for each one, and with a plate displacement of 5 mm in each cycle). Subsequently, the sample was immersed into a baker containing dehydronapthalene (as one example of a suitable solvent) to wash the unexposed area. To facilitate the removal of nano particles from the PET surface, ultrasonic waves were applied to the solution by placing the dehydronapthalene-containing baker in an ultrasonic water bath. After washing the coating, which had, in this example, a thickness of 1010 nm, was seen to have the reversed pattern of the printed silver pattern, as shown in the comparison of a printed silver grid (FIG. 4A) with the patterned coating (FIG. 4B). In the silver nano particle coating, the area blocked by the pre-existing (pre-printed) silver pattern was removed and the two separate patterns were precisely aligned with each other. For the sample in FIG. 4A, the lowest resistance of the remaining coating between two adjacent corners was measured to be 130 k$\Omega$, which dropped to 1.2$\Omega$ after the sample was thermally annealed at 130° C. for 30 minutes.

Each pattern of the remaining silver particle coating was observed to precisely mirror the corresponding pre-existing silver pattern that was used to block the light. As shown by way of example in FIGS. 5A and 5B, it can be observed under an optical microscope that, after the process is complete, the area covered by the pre-existing silver pattern on the other side of the PET film (FIG. 5A) is free of silver on the silver nano particle-coated side of the film (FIG. 5B). Even the edge defects in the pre-existing silver pattern are transferred to the newly generated pattern, which further demonstrates the high precision of the alignment between the two layers.

In a further example (Example 3), a PET film (ST 505 from Dupont) with a silver pattern printed on one side was spread-coated with silver nano ink (EMD5603 from Sunjet) on its other side using a glass tube. After being dried at 65° C., the coating was exposed in the photonic curing R&D system (Sinteron 2000 from Xenon Corporation) with the printed silver pattern facing up and the new coating facing down. The light exposure was carried out in the condition of 2.6 kV, continuous exposure at 120 microseconds, and a plate displacement of 1 mm/s. Subsequently, the sample was immersed into water in a baker, which was placed in the water bath of an ultrasonic cleaner for 1 minute, and then rinsed with clean water. The dried coating was seen to have the nano particles completely removed in the area blocked by the printed silver on the opposite side of the PET film, and the edges of the remaining coating precisely mirrored the ones of the printed silver (as shown by way of example in FIG. 6). After post thermal annealing, the remaining coating was measured to be highly conductive.

Figure 7A:
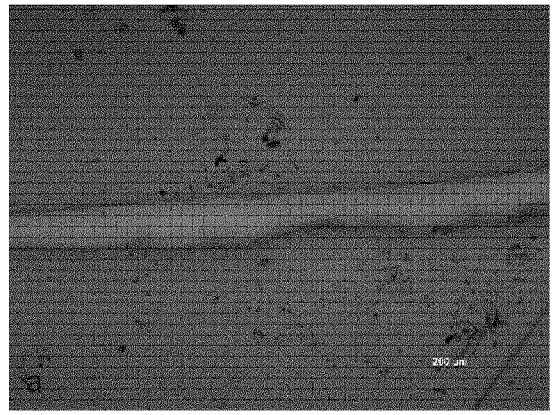
FIGS. 7A and 7B depict a coating of silver nano particles on PET film wherein the coating was exposed to intense pulsed light from a back side of its substrate.
Figure 7B:
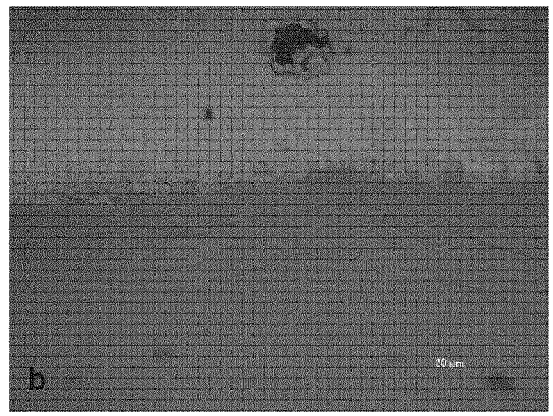

In a further example (Example 4), a silver nano particle paste (ANP-NRC-140812 from Advanced Nano Product Co.) was diluted with α-terpinol and spread-coated on the PET film (ST 505 of Dupont) with a silver pattern printed on its other side using a glass tube. After being dried at 65° C., the coating was exposed in the photonic curing R&D system (Sinteron 2000 from Xenon Corporation) with the printed silver pattern facing up and the coating facing down. The light exposure was carried out in the condition of 2.8 kV, continuous exposure at 300 microseconds, and a plate displacement of 1 mm/s. Subsequently, the sample was immersed into methanol in a baker, which was placed in the water bath of an ultrasonic cleaner for 10 minutes, and then rinsed with clean methanol. The dried coating was seen to have the nano particles completely removed from the area blocked by the printed silver on the opposite side of its substrate, and the edges of the remaining coating precisely mirrored the ones of the printed silver (as shown by way of example in FIG. 7).

Figure 8A:
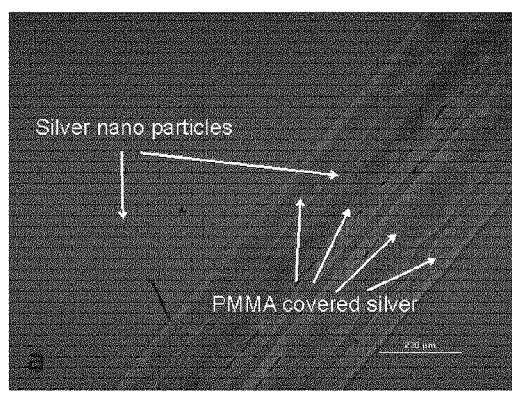
FIGS. 8A and 8B depict a coating of silver nano particle ink on a PMMA-covered PET film wherein 300 nm PMMA was coated on the PET with the printed silver pattern and the sample was exposed to intense pulsed light from the back side of the PET with subsequent development carried out in water.
Figure 8B:
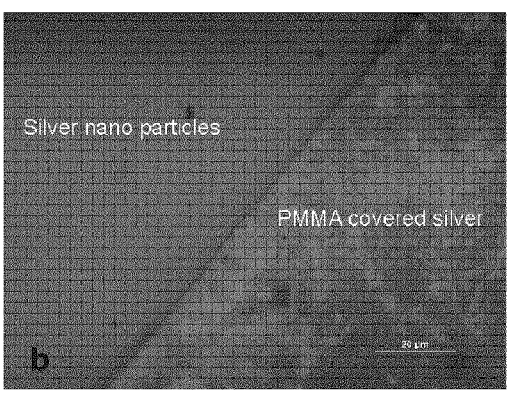

Further testing revealed that the above process works even better when the pre-existing metal pattern layer is disposed on the same side of the substrate as the metal nano particles. In Example 5, 300 nm-thick PMMA was spin-coated directly on the PET (ST 505 of Dupont) surface with a printed silver pattern using a PMMA solution (Mw=120000, in butyl acetate solution), and dried at an elevated temperature. On the PMMA layer, silver nano ink (EMD5603 from Sunjet) was spread-coated using a glass tube. The dried coating was exposed in the photonic curing R&D system (Sinteron 2000 of Xenon Corporation) with bare PET facing up and the new coating facing down. The light exposure was carried out in a condition of 2.6 kV, continuous exposure at 200 microseconds, and a plate displacement at 1 mm/s. After being developed in water with the assistance of ultrasonic waves, the nano particles over the pre-existing silver pattern were completely removed and the exposed particles remained, having been partially sintered by the light. The edges of the two layers precisely match with each other as shown by way of example in FIG. 8. The nano particles were even deposited within the narrow gaps of the pre-existing silver lines (as depicted in FIG. 8A). The obtained pattern of the nano-particle coating in this case has better edge quality than that of the one when the pre-existing silver pattern was on the other side of the PET film (FIG. 6).

The results described above were also validated by another nano particle sample. In Example 6, a layer of 300 nm-thick PMMA was first deposited on the PET surface with a printed silver pattern in a process as described above, and the silver of Advanced Nano Product Co. (ANP-NRC-140812) was spread coated on the PMMA using a glass tube in the process as described earlier. The dried coating was exposed in the photonic curing R&D system (Sinteron 2000 from Xenon Corporation) with bare PET facing up and the new coating facing down, and in the condition of 2.8 kV, continuous exposure at 300 micro seconds, and plate displacement at 1 mm/s. Subsequently, the sample was developed in ethanol with the assistance of ultrasonic waves. FIG. 9 shows the obtained pattern of the silver nano particle coating with sharper edges than that when the pre-existed silver pattern was on the other side of the PET film as in Example 4.

The improved resolution described above is mostly due to the reduced light diffraction. As the PET film was 170 μm thick and the light source used for exposure was not collimated in the setup, the light masked from the pre-existing silver pattern may diffract into the other area of the nano particle coating on the another side of the PET film. When the coating is sitting on the pattern layer with an interlayer only 300 nm thick, such diffraction is substantially decreased. Given that many electronic devices are based on a structure having a thin interlayer to separate two conductive layers and require high-resolution alignment between the layers, the present method would work very well.

For printable electronics, it is desirable to be able to precisely print the material only in a desired area. In Example 7, the present method was demonstrated in self-aligned silver line printing. Silver nano ink (EMD5603) from Sunjet was printed on the PMMA covered surface as described in Example 5 using an inkjet printer (DMP5005) from Damatix as parallel lines. The dried lines (200 nm thick) were exposed in the photonic curing R&D system (Sinteron 2000 from Xenon Corporation) with bare PET facing up and the printed lines facing down in the condition of 2.6 kV, continuous exposure for 200 microseconds, and plate displacement of 1 mm/s. After being developed in water, the nano particles over the pre-existing silver pattern were completely removed and the rest of the partially sintered particles remained. FIG. 10A shows the area where a printed line crosses over two pre-existing silver lines. The material in the line was removed in the area where there were pre-existing silver lines underneath, resulting in the structure similar to a top-gated transistor or a bottom-gated transistor. FIG. 10B shows that the etched edges of the printed line precisely match the line edges of the pre-existing silver line, thus demonstrating that the self-aligning technique disclosed herein can be used to fabricate high-precision aligned layers for a printable electronic device.

Self-alignment of metal deposition has traditionally been a challenge for printing electronic devices. Though several prior-art methods have been reported, these either require complicated a pre-patterning process or lack reliability, making them unsuitable to be scaled up for manufacturing or production. The present method, in contrast, is simple, reliable and robust, and is suitable for both small-scale fabrication and mass production of printable electronic devices.

From the foregoing description, it is apparent that the present method provides for self-alignment of a first layer with a second layer. This method for aligning layers is useful, as noted above, in fabricating a multilayer printable electronic device. The first and second layers may be printed with conductive metal nano particle ink to form part of a bottom-gated or top-gated transistor.

In general, the method may be summarized as including the following steps, acts or operations: providing a transparent substrate upon which a first metal layer is deposited, providing a transparent functional layer (such as, for example, a dielectric layer or a semiconducting layer) over the first metal layer, depositing metal nano particles over the functional layer to form a second metal layer, exposing the metal nano particles to intense pulsed light via an underside of the substrate to partially sinter exposed particles to the functional layer whereby the first metal layer acts as a photo mask, and washing away unexposed particles using a solvent to leave partially sintered metal nano particles on the substrate. Partially sintered particles may then be post sintered in order to fully sinter the particles to the substrate. Post sintering may be accomplished by photonic sintering or thermal treatment (annealing). Washing may be enhanced by exposing the partially sintered particles to ultrasonic waves. In one embodiment of the method, a particle-carrying solvent is first evaporated before exposing the particles to the intense pulsed light.

In one embodiment, the substrate is a polyethylene terephthalate (PET) film and the metal nano particles are silver nano particles. Based on the test results and examples described above, it stands to reason that other metal nano inks and other substrates may be employed to achieve substantially similar self-alignment results. The substrate may alternatively be a polyethylene-naphthalate (PEN) film, a polyimide film, a polycarbonate film, or glass. The particles may alternatively be gold, copper or aluminum. Partial sintering may be achieved with pulsed light having a wavelength of 300 to 900 nm, a voltage level of 1 kV-3 kV, and an exposure time of 100-1000 microseconds.

It is to be understood that the singular forms "a", "an" and "the" include plural referents unless the context clearly dictates otherwise. Thus, for example, reference to "a device" includes reference to one or more of such devices, i.e. that there is at least one device. The terms "comprising", "having", "including" and "containing" are to be construed as open-ended terms (i.e., meaning "including, but not limited to,") unless otherwise noted. All methods described herein can be performed in any suitable order unless otherwise indicated herein or otherwise clearly contradicted by context. The use of examples or exemplary language (e.g. "such as") is intended merely to better illustrate or describe embodiments of the invention and is not intended to limit the scope of the invention unless otherwise claimed.

The embodiments of the invention described above are intended to be exemplary only. As will be appreciated by those of ordinary skill in the art, to whom this specification is addressed, many obvious variations, modifications, and refinements can be made to the embodiments presented herein without departing from the inventive concept(s) disclosed herein. The scope of the exclusive right sought by the applicant(s) is therefore intended to be limited solely by the appended claims.

The invention claimed is:

1. A method for aligning metal layers in fabricating a multilayer printable electronic device, the method comprising:
    providing a transparent substrate upon which a first metal layer is deposited;
    providing a transparent functional layer over the first metal layer;
    depositing metal nano particles over the transparent functional layer to form a second metal layer;
    exposing the metal nano particles to intense pulsed light via an underside of the transparent substrate to partially sinter the exposed metal nano particles to the transparent functional layer whereby the first metal layer acts as a photo mask; and
    washing away unexposed metal nano particles using a solvent to leave the partially sintered metal nano particles on the transparent substrate.

2. The method of claim 1, further comprising post sintering the partially sintered metal nano particles to form fully sintered metal on the transparent substrate.

3. The method of claim 1, wherein a particle-carrying solvent is evaporated before exposing the metal nano particles to the intense pulsed light.

4. The method of claim 1, wherein the transparent substrate is a polyethylene terephthalate film.

5. The method of claim 1, wherein the transparent substrate is a polyethylene-naphthalate (PEN) film.

6. The method of claim 1, wherein the transparent substrate is a polyimide film.

7. The method of claim 1, wherein the transparent substrate is a polycarbonate film.

8. The method of claim 1, wherein the transparent substrate is glass.

9. The method of claim 1, wherein the metal nano particles are silver.

10. The method of claim 1, wherein the metal nano particles are one of gold, copper and aluminum.

11. The method of claim 1, wherein the transparent functional layer is a dielectric layer.

12. The method of claim 1, wherein the transparent functional layer is a semiconducting layer.

13. The method of claim 1, wherein a voltage level of the intense pulsed light is 1 kV 3 kV.

14. The method of claim 1, wherein a total exposure time of the intense pulsed light is 100-1000 microseconds.

15. The method of claim 1, wherein a wavelength of the intense pulsed light is 300 to 900 nm.

16. The method of claim 1, wherein the washing is performed in a presence of ultrasonic waves.

17. The method of claim 16, wherein the washing is performed in a container.

18. The method of claim 2, wherein the post sintering comprises annealing.

19. The method of claim 2, wherein the post sintering comprises photonic sintering.

20. The method of claim 1, wherein the first and second metal layers form part of a bottom-gated or top-gated transistor.

21. The method of claim 1, wherein exposing the metal nano particles to intense pulsed light via an underside of the transparent substrate to partially sinter the exposed metal nano particles to the transparent functional layer whereby the first metal layer acts as a photo mask comprises exposing the metal nano particles to a minimum required optical power to minimally connect the metal nano particles to the transparent functional layer to resist washing off during the washing step.

* * * * *